US011229090B2

(12) United States Patent
Barako et al.

(10) Patent No.: US 11,229,090 B2
(45) Date of Patent: Jan. 18, 2022

(54) MULTILAYERED NANOWIRE ARRAYS WITH LATERAL INTERPOSERS

(71) Applicant: NORTHROP GRUMMAN SYSTEMS CORPORATION, Falls Church, VA (US)

(72) Inventors: Michael T. Barako, Redondo Beach, CA (US); Jesse B. Tice, Torrance, CA (US); Max H. Kuciej, Los Angeles, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/409,107

(22) Filed: May 10, 2019

(65) Prior Publication Data

US 2020/0359465 A1    Nov. 12, 2020

(51) Int. Cl.
| | | |
|---|---|---|
| B23K 20/02 | (2006.01) | |
| H05B 3/34 | (2006.01) | |
| B32B 5/02 | (2006.01) | |
| B32B 5/12 | (2006.01) | |
| B32B 5/26 | (2006.01) | |

(Continued)

(52) U.S. Cl.
CPC ............... *H05B 3/34* (2013.01); *B32B 5/028* (2013.01); *B32B 5/12* (2013.01); *B32B 5/26* (2013.01); *C25D 5/34* (2013.01); *H01L 23/3735* (2013.01); *H05B 3/0004* (2013.01); *H05K 7/2039* (2013.01); *B32B 2262/103* (2013.01); *H05B 2203/007* (2013.01); *H05B 2203/014* (2013.01);

(Continued)

(58) Field of Classification Search
CPC ........................................................ H05B 3/34
USPC ........................................................ 428/114
See application file for complete search history.

(56) References Cited

U.S. PATENT DOCUMENTS

| 9,468,989 B2 | 10/2016 | Starkovich et al. |
| 9,601,452 B2 | 3/2017 | Starkovich et al. |

(Continued)

FOREIGN PATENT DOCUMENTS

EP    3252811 A1    12/2017

OTHER PUBLICATIONS

Le, T.C., et al., "Fabrication of giant magneto resistance sensing devices with vertically grown Co/Cu nanowires on a substrate",J. Micro/Nanolith. MEMS MOEMS 8(4), 2009. (Year: 2009).*

(Continued)

*Primary Examiner* — Brent T O'Hern
(74) *Attorney, Agent, or Firm* — John A. Miller; Shumaker, Loop & Kendrick, LLP

(57) ABSTRACT

A method for fabricating a multilayered metal nanowire array including providing a metal seed layer, stacking a plurality of porous templates on the seed layer so that a gap forms between each adjacent pair of templates, depositing by electroplating a metal in the pores so that the metal produces nanowires in the templates and lateral interposers in the gaps between the templates, and dissolving the templates so as to produce the multilayered nanowire array including the lateral interposers. The layers between the interposers can have the same or different thicknesses, the diameter and density of the pores in each layer can be the same or different and the metal deposited in the pores of the layers can be the same or different.

14 Claims, 5 Drawing Sheets

(51) Int. Cl.
*C25D 5/34* (2006.01)
*H01L 23/373* (2006.01)
*H05B 3/00* (2006.01)
*H05K 7/20* (2006.01)

(52) U.S. Cl.
CPC .... *H05B 2203/017* (2013.01); *H05B 2214/04* (2013.01)

(56) References Cited

U.S. PATENT DOCUMENTS

| | | |
|---|---|---|
| 10,180,288 B2 | 1/2019 | Starkovich et al. |
| 2006/0131679 A1* | 6/2006 | Hantschel ........... H01L 29/0665 257/415 |
| 2006/0134392 A1* | 6/2006 | Hantschel ............. C01B 19/007 428/210 |
| 2006/0134883 A1* | 6/2006 | Hantschel ............... C30B 29/60 438/458 |
| 2013/0228466 A1* | 9/2013 | Sun ........................ B01D 69/12 205/67 |
| 2016/0250710 A1* | 9/2016 | Starkovich ........... C25D 7/0607 428/687 |
| 2016/0251769 A1 | 9/2016 | Silverman et al. |
| 2016/0258069 A1 | 9/2016 | Nesbitt et al. |

OTHER PUBLICATIONS

Chen, X., et al., "Fabrication of free-standing Cu nanorod arrays on Cu disc by template-assisted electrodeposition", Nanotechnology, 19, 2008, p. 1-6. (Year: 2008).*

* cited by examiner

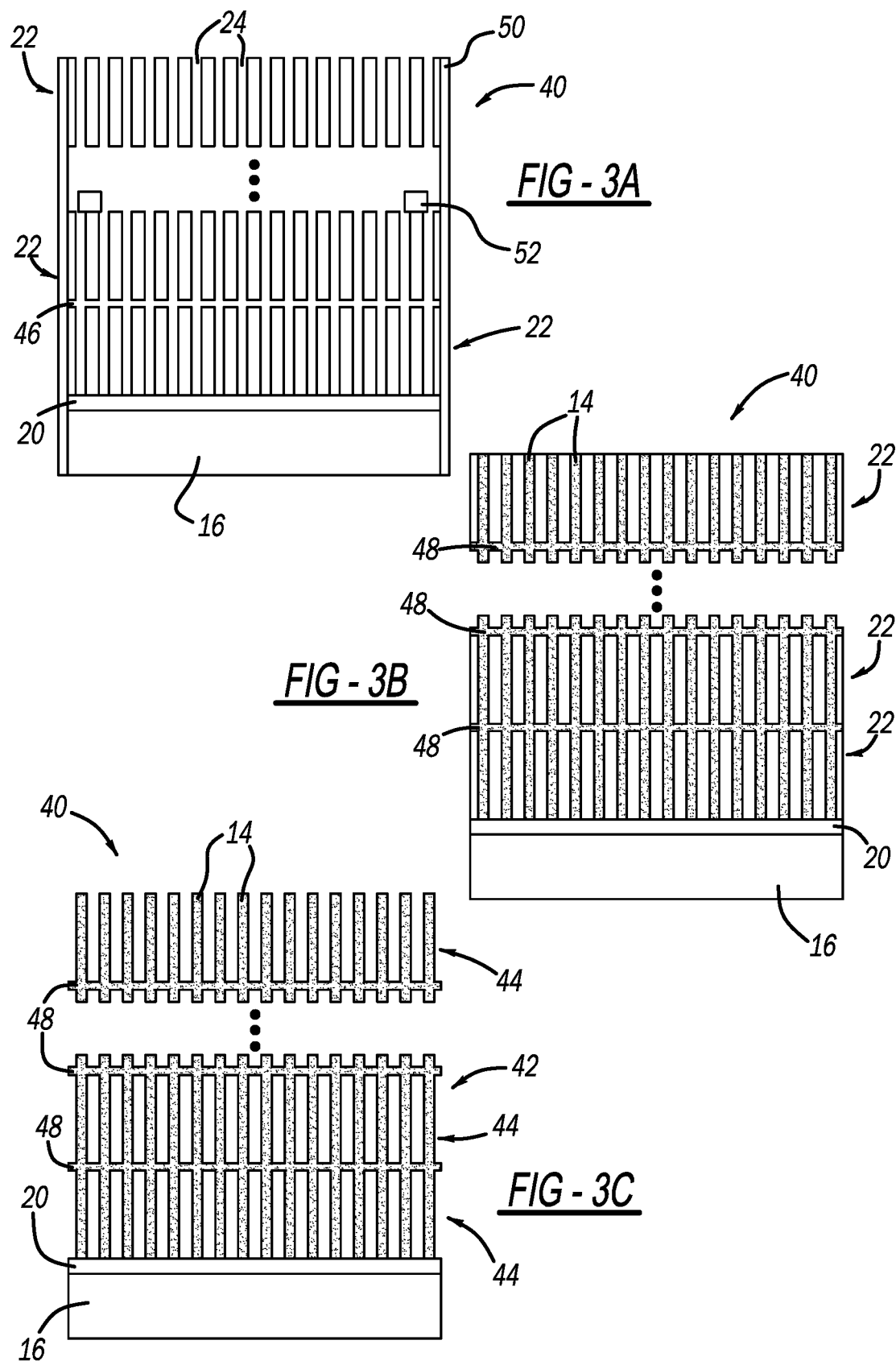

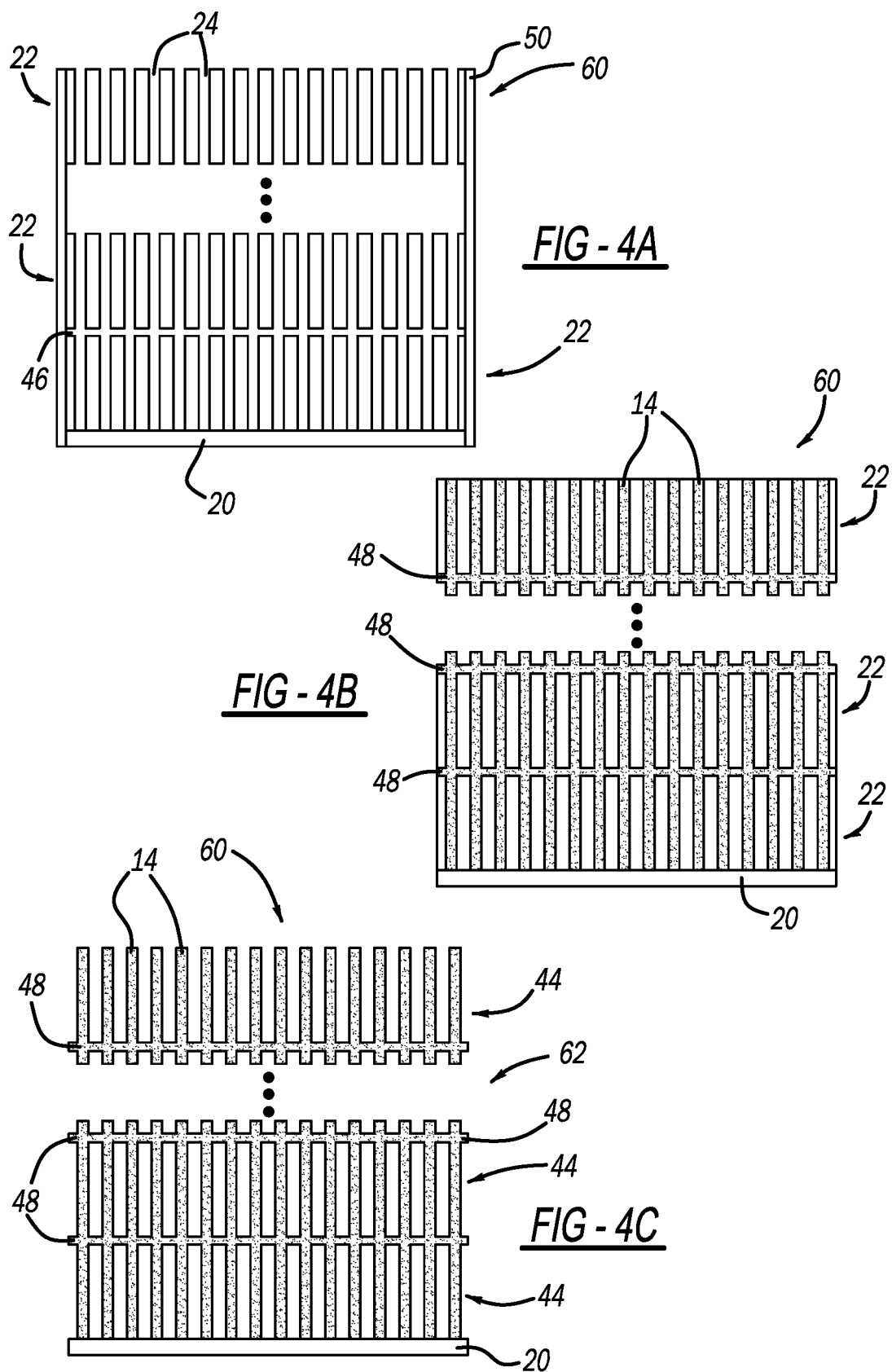

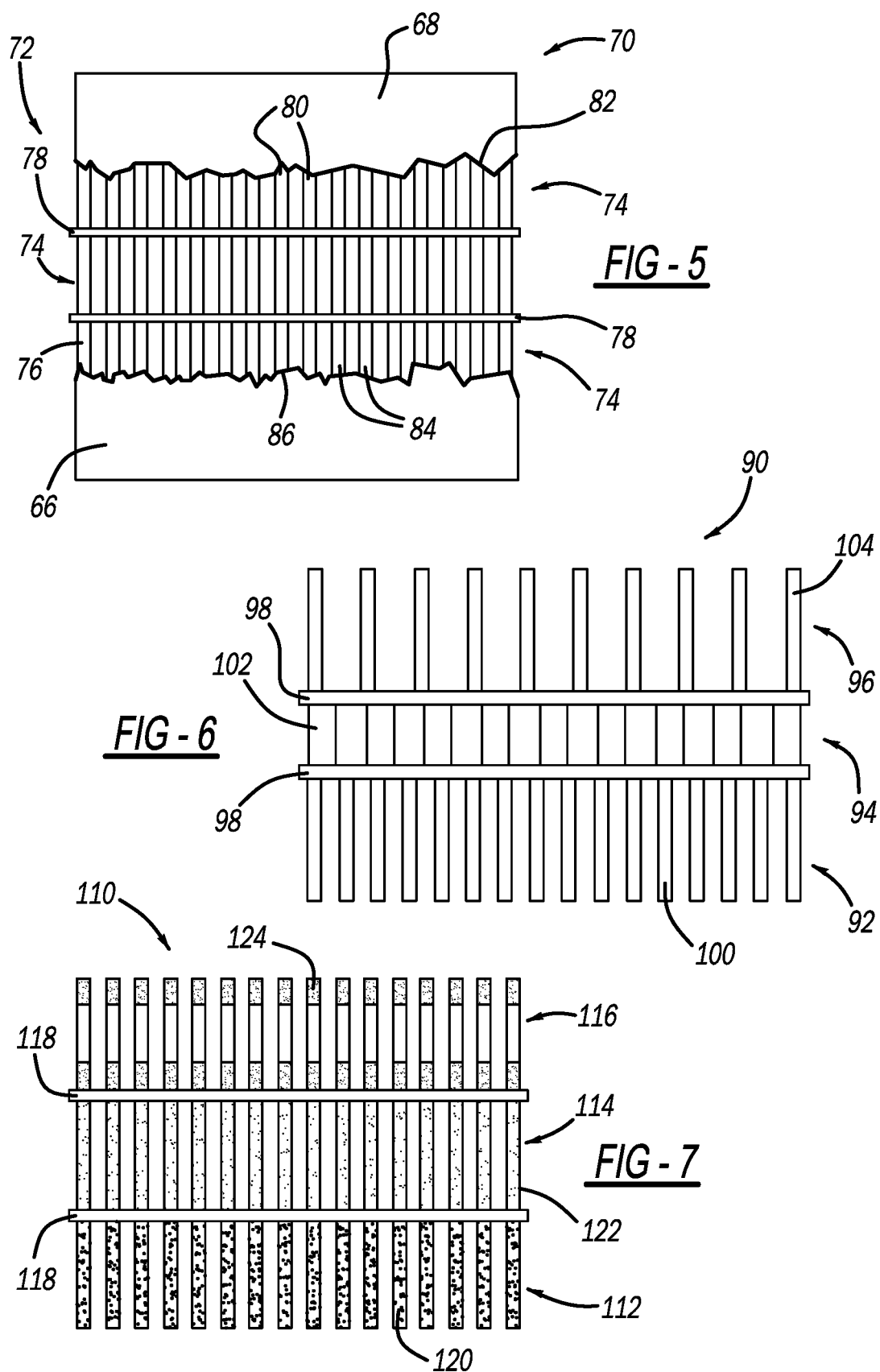

MULTILAYERED NANOWIRE ARRAYS WITH LATERAL INTERPOSERS

BACKGROUND

Field

This disclosure relates generally to a multilayered metal nanowire array and a method of fabricating the nanowire array and, more particularly, to a multilayered metal nanowire array including lateral interposers provided between the array layers.

Discussion

A metal nanowire array is a forest of vertically aligned metal nanowires, such as copper, silver, gold, etc., typically having a density greater than $10^7$ cm$^{-2}$. Metal nanowire arrays are known to be used as a mechanism for an efficient and reliable transfer of heat from a source to a heat sink for thermal management of microelectronics. For this application, metal nanowire arrays provide a soft and thermally conductive structure that is able to conform to and fill in gaps, for example, between a silicon die and a copper heat sink. More specifically, metal nanowire arrays are soft and deformable, which allows them to conform to rough surfaces and provide heat transfer capabilities. Furthermore, metal nanowire arrays are soft and compliant and can mitigate thermomechanical stresses at material interfaces, for example, stresses induced at the interface due to coefficient of thermal expansion mismatch. In other words, dense arrays of vertically aligned metal nanowires offer the unique combination of thermal conductance from a constituent metal and mechanical compliance from high aspect ratio geometry to increase interfacial heat transfer and device reliability.

Metal nanowire arrays that are employed for thermal heat transfer purposes are typically fabricated by providing a porous membrane, used as a sacrificial template, such as a ceramic template, filling the pores in the template with metal using an electrodeposition process and then etching away the template. Thus, the length, diameter and density of the nanowires are determined by the geometry of the template, where the available configuration of the template sets the possible configuration of the nanowire array. Therefore, the thickness of the nanowire array is limited by the available thickness of the templates, where the thickness of the template is limited by the processes that form it.

For today's technologies, a typical metal nanowire array has a maximum thickness of about 100 µm. However, certain electrical devices may have gaps that need to be filled between, for example, 100 µm and 2 mm. It is possible to stack metal nanowire arrays on top of each other to accommodate such gaps, but that causes interfaces between the arrays that create loss of heat transfer capabilities. Therefore, other heat sink materials are often employed for larger gaps than 100 µm, such as a polymer fill, that have reduced heat transfer capabilities than metal nanowire arrays.

Further, known single layer metal nanowire arrays that have vertically-aligned nanowires are able to effectively move heat along the length of the nanowires, but have poor lateral conductivity as a result of being nearly completely unidirectional, i.e. vertically aligned. However, for some applications, it may be desirable to laterally spread the heat being removed from the device or conduct electricity along the array. For example, the electrical conduction capability of a metal nanowire array parallels the thermal conduction capability of the array, where the lateral electrical conduction may be desirable for some applications, such as a ground plane.

BRIEF DESCRIPTION OF THE DRAWINGS

FIGS. 3A-3C show profile views of a series of sequential steps of a process for fabricating an "on substrate" metal multilayered nanowire array including interposers;

FIGS. 4A-4C show profile views of a series of sequential steps of a process for fabricating a freestanding multilayered metal nanowire array including interposers;

FIG. 5 is a side view of an electronic assembly including a multilayered metal nanowire array having interposers, where one end of the array is positioned against a heat source and an opposite end of the array is positioned against a heat sink;

FIG. 6 is a profile view of a multilayered metal nanowire array where each layer has a different nanowire diameter, nanowire density and/or layer thickness; and FIG. 7 is a profile view of a multilayered metal nanowire array where each layer has a different nanowire composition.

DETAILED DESCRIPTION OF THE EMBODIMENTS

The following discussion of the embodiments of the disclosure directed to a stacked multilayered metal nanowire array including lateral interposers provided between nanowire array layers and a method for fabricating the multilayered metal nanowire is merely exemplary in nature, and is in no way intended to limit the disclosure or its applications or uses. For example, the metal nanowire arrays are described as having application as a heat transfer device. However, as will be appreciated by those skilled in the art, the nanowire arrays may have other applications.

Figure 1A:
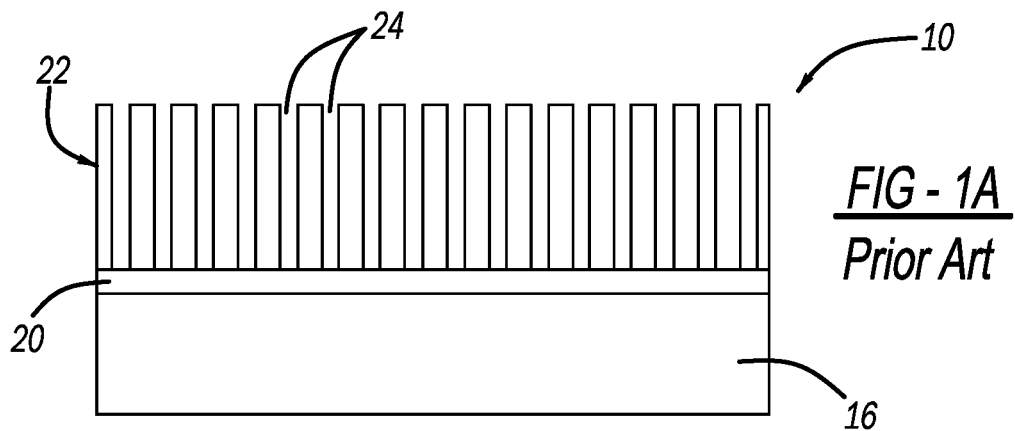
FIGS. 1A-1C show profile views of a series of sequential steps of a known process for fabricating an "on substrate" metal nanowire array.
Figure 1B:
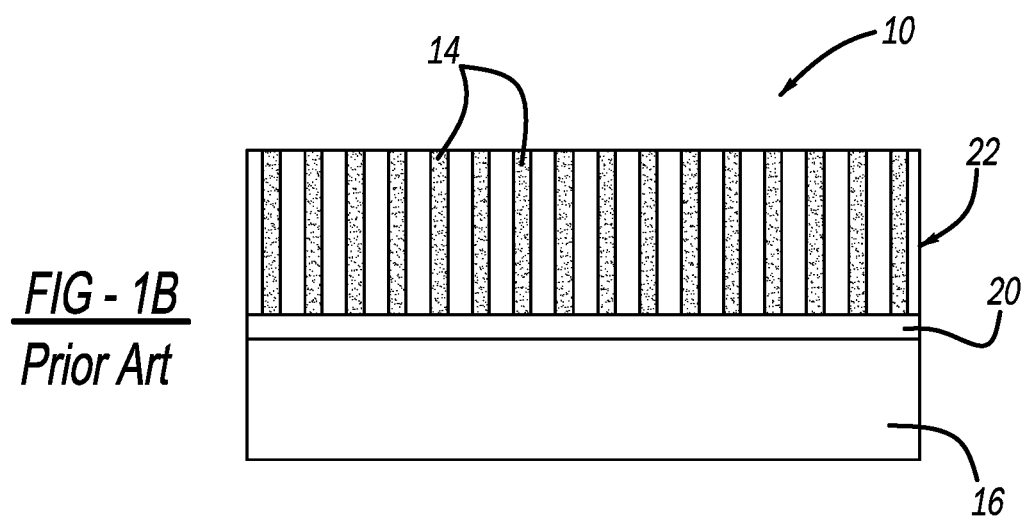
Figure 1C:
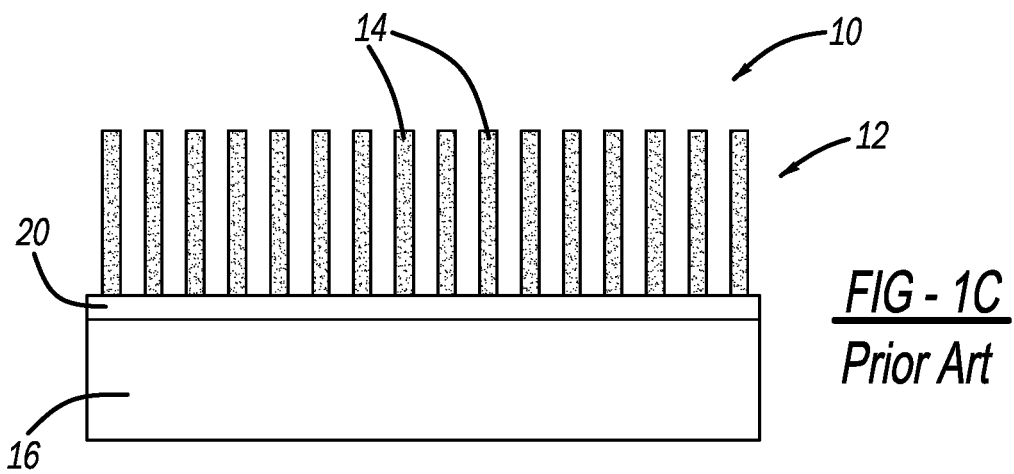

FIGS. 1A-1C show illustrations 10 of profile views of a series of sequential steps of a known "on substrate" process for fabricating a metal nanowire array 12 including vertically aligned and cylindrical metal nanowires 14 on a rigid substrate 16, where the substrate 16 may be the component that heat is being drawn away from or the heat sink that the heat is being drawn to. FIG. 1A shows a thin metal seed layer 20, for example, a 50 nm thick gold layer, that provides an electrical growth surface for the nanowires 14 deposited on the substrate 16. A template 22, such as a porous polymer or ceramic membrane, having vertically aligned cylindrical pores 24 is positioned on the seed layer 20, such as by positioning the template 22 within a fixture (not shown) so that the template 22 is held in place from the sides, where the template 22 may be, for example, an inch square or a four-inch diameter circle and 100 µm thick. Although the pores 24 are cylindrical in this embodiment, it is known to provide templates having pores of other shapes that generate nanowires having that shape. The template 22 can be made by any suitable process to provide the pores 24, such as by a hard anodization process known to those skilled in the art.

FIG. 1B shows that the nanowires 14 have been deposited or grown on the seed layer 20 and have filled the pores 24 such as by a suitable electrochemical deposition or electroplating process, where the seed layer 20 is used as a conductive interface for the electroplating process, so that a top of the nanowires 14 are even with a top end of the pores 24. This can be obtained by providing a uniform growth where the deposition of the nanowires 14 is terminated when they exactly reach the top end of the pores 24 or by polishing the top surface of the seed layer 22 after the nanowires 14 are deposited. The array 12 is then subjected to a chemical etch that dissolves and removes the template 22 as shown in FIG. 1C to liberate the nanowires 14 and create the nanowire array 12.

Figure 2A:
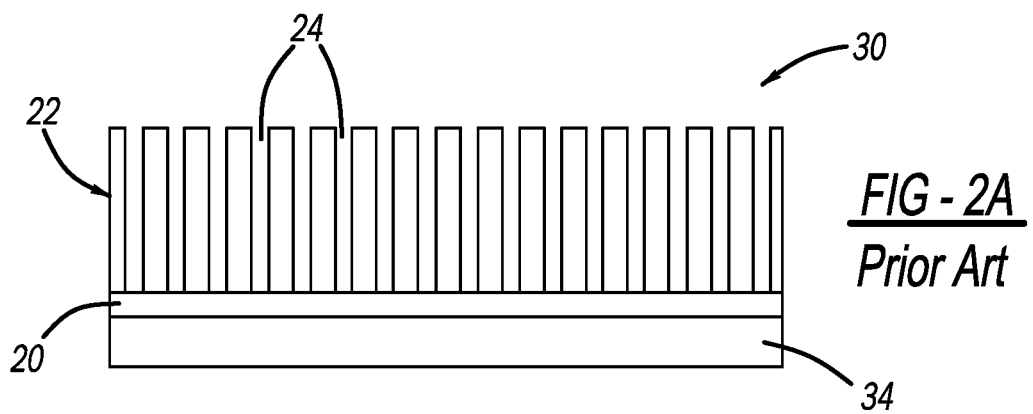
FIGS. 2A-2C show profile views of a series of sequential steps of a known process for fabricating a "freestanding" metal nanowire array including a backing layer.
Figure 2B:
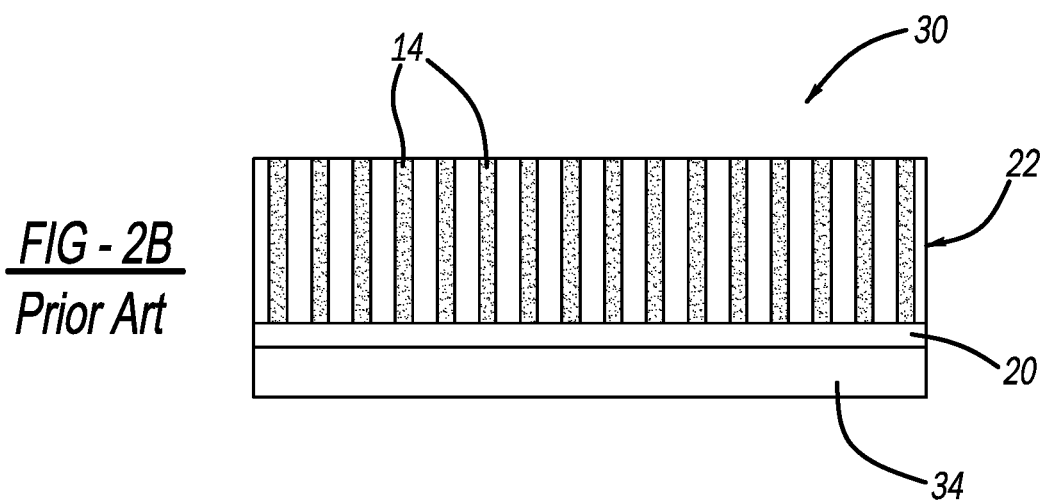
Figure 2C:
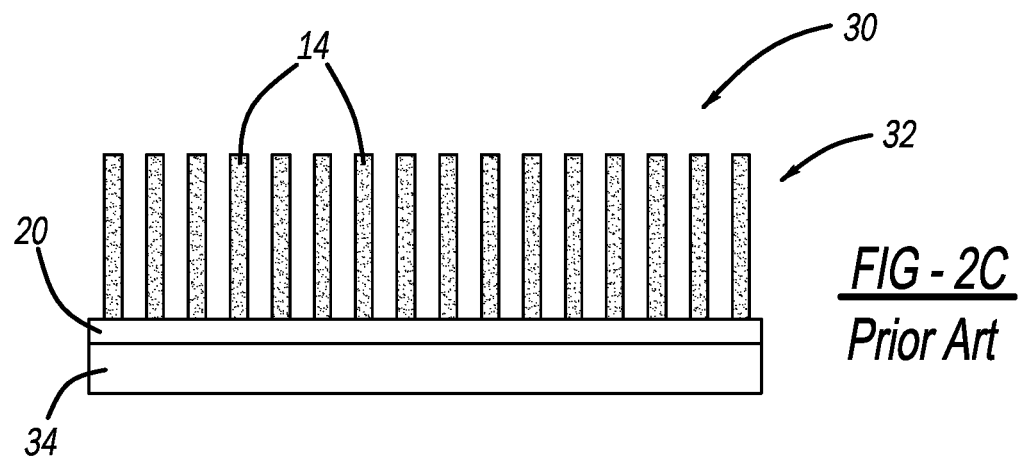

FIGS. 2A-2C show illustrations 30 of profile views of a series of sequential steps of a known freestanding growth process for fabricating a metal nanowire array 32, where like elements to the illustrations 10 shown in FIGS. 1A-1C have the same reference number. In this embodiment, the metal seed layer 20 is deposited directly onto the template 22. The seed layer 20 may be thickened before being attached to the template 22 by a metal backing support layer 34, where the backing layer 34 may then be attached to the component that heat is being drawn away from.

As will be discussed in detail below, the present disclosure describes a method for fabricating a multilayered metal nanowire array that includes providing lateral interposers between the individual array layers that are formed by stacked templates. FIGS. 3A-3C show illustrations 40 of profile views of a series of sequential steps of an "on substrate" process for fabricating a multilayered metal nanowire array 42 including a stack of nanowire array layers 44 each including the metal nanowires 14 on the substrate 16, where like elements to the illustrations 10 shown in FIGS. 1A-1C are identified by the same reference number. FIG. 3A shows three of the templates 22 stacked on top of each other, where they would be placed in a fixture 50 to form the stack so that the natural surface roughness of the templates 22 creates small lateral gaps 46 between the stacked templates 22, where the fixture 50 is only shown in FIG. 3A. It is noted that the space between the top two templates 22 indicates that many other templates 22 can be provided in the stack, such as ten of the templates 22. It is further noted that although the pores 24 from one template 22 to the next template 22 are shown aligned with each other, this is merely for illustrative purposes where the density of the pores 24 is very high, such as 25-50%, and would be randomly distributed.

FIG. 3B shows that when the electroplating process is performed to form the nanowires 14 in the pores 24 the electroplating process also fills the gaps 46 with metal to form metal lateral interposers 48 that are thermally and electrically coupled to the nanowires 14. The lateral interposers 48 allow the nanowires 14 from one array layer 44 to the next array layer 44 to be electrically and thermally coupled, where the array 42 is a single metal unit. Further, the interposers 48 allow electrical and thermal conduction in a lateral direction across the nanowire array 42. It is noted that although the thickness of the interposers 48 are defined by the natural gap 46 that forms between the templates 22, in other embodiments, the thickness of the interposers 48 can be increased to any suitable thickness by providing mechanical spacers 52 between the templates 22 in the fixture 50. The spacers 52 can be of any suitable configuration and thickness that allows the interposers 48 to form around them.

FIGS. 4A-4C show illustrations 60 of profile views of a series of sequential steps of a freestanding growth process for fabricating a multilayered metal nanowire array 62, where like elements to the illustrations 40 shown in FIGS. 3A-3C have the same reference number. In this embodiment, the seed layer 22 is required, but the backing support layer 34 is not needed because the interposers 48 hold the nanowire layers 44 together. Specifically, by providing the interposers 48, the nanowire array 62 becomes more robust and easier to handle during the manufacture of the electrical devices. Further, since the nanowire array 62 is held together by the interposers 48, tips of the nanowires 14 at the top and bottom layers 44 can be in contact with the rough surfaces of the various components without the need for a backing support layer.

FIG. 5 is a side view of an electronic assembly 70 including a multilayered metal nanowire array 72 positioned between an electrical component 66 and a heat sink 68, where heat is being transferred from the component 66 to the heat sink 68 through the array 72. The nanowire array 72 includes three array layers 74 having nanowires 76 held together by lateral interposers 78. Tips 80 of the nanowires 76 at one end of the array 72 conform to a rough surface 82 of the heat sink 68 and tips 84 of the nanowires 76 at an opposite end of the array 72 conform to a rough surface 86 of the component 66 to illustrate how the nanowires 76 can conform to a rough surface for increased heat transfer capabilities.

The discussion above shows the nanowire array layers 44 are homogeneous in that they all have the same configuration of the nanowires 14. However, in other embodiments, the nanowires layers 44 in the multilayer nanowire arrays 42 and 62 can have different diameter nanowires, different length nanowires, different density nanowires, different thickness of sections, different thickness of the interposers, etc. This may be desirable for certain electrical, thermal, chemical, optical and/or other functional uses of the nanowire array.

To illustrate this, FIG. 6 is a profile view of a multilayered metal nanowire array 90 including three nanowire array layers 92, 94 and 96 separated by lateral interposers 98, where the layer 92 has one thickness and includes nanowires 100 of one density and diameter, the layer 94 has another thickness and includes nanowires 102 of another density and diameter, and the layer 96 has a third thickness and includes nanowires 104 of a third density and diameter. By selecting different templates for each layer different combinations of individual layer arrays can be stacked in the final multilayered nanowire array.

Further, it is possible to change the chemicals used for electroplating the nanowires during the fabrication process so that the nanowires in one layer of the multilayered metal nanowire array may have a different thermal or electrical conductivity that other layers. To illustrate this, FIG. 7 is a profile view of a multilayered metal nanowire array 110 including three nanowire array layers 112, 114 and 116 separated by lateral interposers 118, where the layer 112 includes nanowires 120 of one metal composition, the layer 114 includes nanowires 122 of another metal composition, and the layer 116 includes nanowires 124 of a third metal composition. Further, the nanowires 124 have a graded composition where the material changes within the layer 116. Such a configuration may have application for a multilayer nanowire array where top and bottom layers include solder and middle layers include a heat sink.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for fabricating a multilayered metal nanowire array, said method comprising:
   stacking a plurality of porous templates so that a gap forms between each adjacent pair of templates;
   depositing a metal in the pores of the templates so that the metal produces nanowires in the templates and lateral interposers in the gaps between the templates; and
   dissolving the templates so as to produce the multilayered nanowire array including the lateral interposers.

2. The method according to claim 1 wherein stacking the templates includes stacking the templates to be in contact with each other so that the gaps are formed by the surface roughness of the templates.

3. The method according to claim 1 wherein stacking the templates includes placing spacers between the templates so that the gaps have a predetermined thickness.

4. The method according to claim 1 further comprising providing a metal seed layer on which the templates are stacked, wherein depositing a metal includes depositing the metal by an electroplating process that uses the seed layer.

5. The method according to claim 1 wherein depositing the metal includes depositing different metals in different templates.

6. The method according to claim 1 wherein stacking a plurality of porous templates includes stacking a plurality of templates that all have the same pore diameters, lengths and density.

7. The method according to claim 1 wherein stacking a plurality of porous templates includes stacking templates having different pore diameters, lengths and/or densities.

8. The method according to claim 1 wherein stacking a plurality of porous templates includes stacking a plurality of templates that all have the same thickness.

9. The method according to claim 8 wherein the thickness is 100 μm.

10. The method according to claim 1 wherein stacking a plurality of porous templates includes stacking templates having different thicknesses.

11. The method according to claim 1 wherein stacking the plurality of templates includes stacking the templates on a substrate.

12. The method according to claim 11 wherein the substrate is a heat source or a heat sink.

13. The method according to claim 1 wherein stacking a plurality of porous templates includes stacking ten porous templates.

14. A method for fabricating a multilayered metal nanowire array, said method comprising:
   stacking a plurality of porous templates so that a gap forms between each adjacent pair of templates, wherein stacking the templates includes stacking the templates to be in contact with each other so that the gaps are formed by the surface roughness of the templates, and wherein stacking a plurality of porous templates includes stacking a plurality of templates that all have the same thickness;
   depositing a metal in the pores of the templates so that the metal produces nanowires in the templates and lateral interposers in the gaps between the templates; and
   dissolving the templates so as to produce the multilayered nanowire array including the lateral interposers.

* * * * *